(12) United States Patent
Chou et al.

(10) Patent No.: US 10,284,189 B1
(45) Date of Patent: May 7, 2019

(54) REDUNDANT ISOLATING SWITCH CONTROL CIRCUIT

(71) Applicant: SEA SONIC ELECTRONICS CO., LTD., Taipei (TW)

(72) Inventors: Sheng-Chien Chou, Taipei (TW); Chih-Sheng Chang, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 0 days.

(21) Appl. No.: 15/830,050

(22) Filed: Dec. 4, 2017

(51) Int. Cl.
*H03K 17/00* (2006.01)
*H03K 17/042* (2006.01)
*H03K 17/687* (2006.01)

(52) U.S. Cl.
CPC ... *H03K 17/04206* (2013.01); *H03K 17/6871* (2013.01)

(58) Field of Classification Search
CPC .............. H03K 17/04206; H03K 17/6871
USPC .............................................. 327/109
See application file for complete search history.

(56) References Cited

U.S. PATENT DOCUMENTS

| | | | | |
|---|---|---|---|---|
| 5,610,547 A * | 3/1997 | Koyama | ............. | G06G 7/24 327/103 |
| 6,469,564 B1 * | 10/2002 | Jansen | ............. | G06G 7/62 327/365 |
| 8,207,779 B2 * | 6/2012 | Hu | ............. | H03K 17/145 327/108 |
| 8,488,355 B2 * | 7/2013 | Berghegger | ......... | H02M 3/33592 363/127 |
| 8,638,580 B2 * | 1/2014 | Kippley | ............. | H02M 3/3378 363/127 |
| 10,056,787 B2 * | 8/2018 | Morikawa | .......... | H02J 50/12 |
| 2005/0253642 A1 * | 11/2005 | Chen | ............. | H03K 17/063 327/427 |
| 2008/0030263 A1 * | 2/2008 | Frederick | ............. | H02J 1/10 327/541 |
| 2009/0285001 A1 * | 11/2009 | Hu | ............. | H02M 1/08 363/126 |

FOREIGN PATENT DOCUMENTS

| | | | |
|---|---|---|---|
| CN | 105450008 A | * | 3/2016 |
| CN | 105450008 A | | 3/2016 |
| WO | WO2008/013895 A1 | | 1/2008 |

\* cited by examiner

*Primary Examiner* — Ryan Jager
(74) *Attorney, Agent, or Firm* — Muncy, Geissler, Olds & Lowe, P.C.

(57) ABSTRACT

A redundant isolating switch control circuit comprises a working power supply, a power input end, a power output end, at least one field-effect transistor, a first transistor, and a second transistor. The field-effect transistor comprises a gate electrode, a source electrode connected to the power input end and a drain electrode connected to the power output end. The first transistor and the second transistor together with the associated circuits form a current mirror circuit. The redundant isolating switch control circuit further comprises a first electronic unit comprising a first connecting end connected to the first base electrode of the first transistor and a second connecting end connected to the second emitter electrode of the second transistor, and a second electronic unit comprising a third connecting end connected to the first collector of the first transistor and a fourth connecting end connected to the gate electrode.

5 Claims, 12 Drawing Sheets

REDUNDANT ISOLATING SWITCH CONTROL CIRCUIT

FIELD OF THE INVENTION

The present invention relates to a redundant isolating switch control circuit.

BACKGROUND OF THE INVENTION

The redundant isolating switch control circuits in the prior art are disclosed in WO 2008/013895 A1 and CN 105450008 A. The simulation of the redundant isolating switch control circuit, as disclosed in CN 105450008 A, has been performed herein during which two redundant isolating switch control circuits 80 and 90 in the different operating states were simulated, as shown in FIG. 1. The redundant isolating switch control circuit 80 is set to have a power at the power input end ($V_{IN1}$) of 12 volts (V), a turn-on time of 20 ms and a turn-off time of 20 ms; while the other redundant isolating switch control circuit 90 is set to have a power at the power input end ($V_{s2}$) of 12 volts (V) and be held at a turn-on state. Additionally, a load 70 of 100 amperes (A) and 0.12 ohms (Ω) is provided. In another aspect, as shown in FIG. 1, a first voltage measurement unit ($V_{G1}$) is configured to measure the gate-source voltage ($V_{GS}$) of a field-effect transistor 81; a first current measurement unit ($I_{O1}$) is configured to measure the output current of the redundant isolating switch control circuit 80; a second current measurement unit ($I_{O2}$) is configured to measure the output current of the redundant isolating switch control circuit 90; a second voltage measurement unit ($V_{IN}$) is configured to measure the voltage at the power input end of the redundant isolating switch control circuit 80; and a third voltage measurement unit ($V_{IN}$) is configured to measure the terminal voltage of the load 70.

As a result of the simulation as described above, as shown in FIG. 2, a very large reverse current will be generated when the voltage at the power input end of the redundant isolating switch control circuit 80 is decreased instantaneously and the field-effect transistor 81 included in the redundant isolating switch control circuit 80 is not turned off in real time.

FIG. 3 shows the results of a simulation test in which the resistance values of resistors 82 and 92 included in the redundant isolating switch control circuits 80 and 90 are reduced, respectively (in this test, the resistance values are reduced from 6.8 kΩ to 3 kΩ). However, as shown in FIG. 3, such modification may increase the conduction loss of the field-effect transistors 81 and 91, although the response speed of the field-effect transistors 81 and 91 may be improved and the generation of large reverse current may be avoided.

SUMMARY OF THE INVENTION

The main objective of the present invention is to solve the problems existing in the implementation of conventional circuits.

In order to achieve the above objective, the present invention provides a redundant isolating switch control circuit comprising a working power supply, a power input end, a power output end, at least one field-effect transistor, a first transistor and a second transistor. The field-effect transistor comprises a gate electrode, a source electrode connected to the power input end and a drain electrode connected to the power output end; the first transistor comprises a first base electrode, a first emitter connected to the power input end and a first collector connected to the working power supply; and the second transistor comprises a second emitter electrode, a second base electrode connected to the working power supply and a second collector connected to the power output end, wherein the second base electrode is connected to the second emitter electrode. The redundant isolating switch control circuit further comprises a first electronic unit comprising a first connecting end connected to the first base electrode and a second connecting end connected to the second emitter electrode; and a second electronic unit comprising a third connecting end connected to the first collector and a fourth connecting end connected to the gate electrode; wherein the first electronic unit is one of a diode, a resistor and a capacitor, and the second electronic unit is one of an integrated circuit module for turn-on or turn-off of the field-effect transistor, a diode and a resistor.

In one embodiment, the redundant isolating switch control circuit comprises a plurality of the field-effect transistors arranged in parallel, and each of the gate electrode of the plurality of the field-effect transistors is connected to the fourth connecting end of the second electronic unit, each of the source electrode of the plurality of the field-effect transistors is connected to the power input end, and each of the drain electrode of the plurality of the field-effect transistors is connected to the power output end.

In one embodiment, the redundant isolating switch control circuit comprises a voltage stabilizing unit connected to the power input end and comprising the working power supply.

In one embodiment, the redundant isolating switch control circuit comprises a first resistor provided between the working power supply and the first collector, and a second resistor provided between the working power supply and the second base electrode.

The above implementations of the present invention provides the following benefits when compared to the prior art: the redundant isolation switch control circuit of the present invention improves the response speed of the field-effect transistor and effectively decrease the reverse current generated by the instantaneous voltage drop at the power input end of the redundant isolation switch control circuit, and the conduction loss of field-effect transistor is also taken into account.

DETAILED DESCRIPTION OF THE PREFERRED EMBODIMENTS

Figure 1:
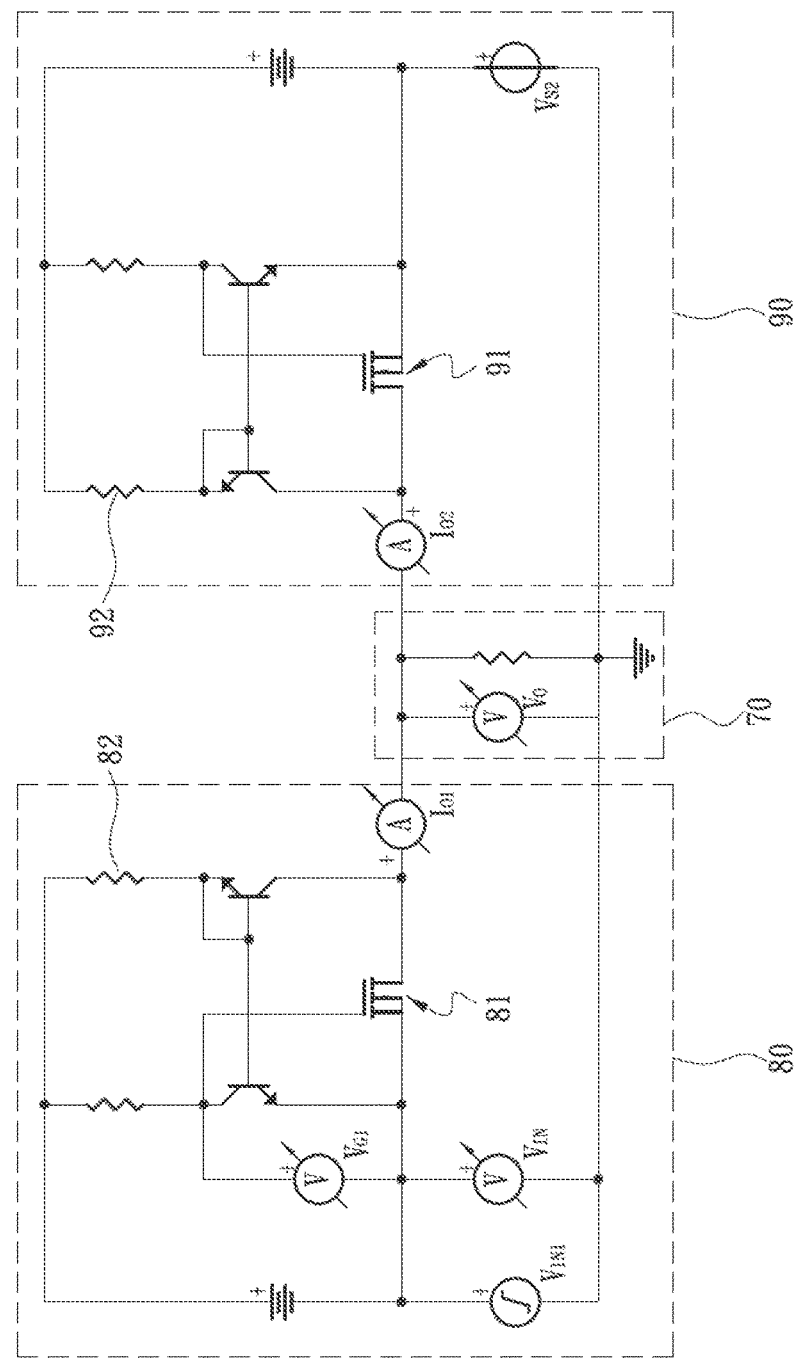
FIG. 1 is a schematic diagram of the circuit in the prior art.
Figure 2:
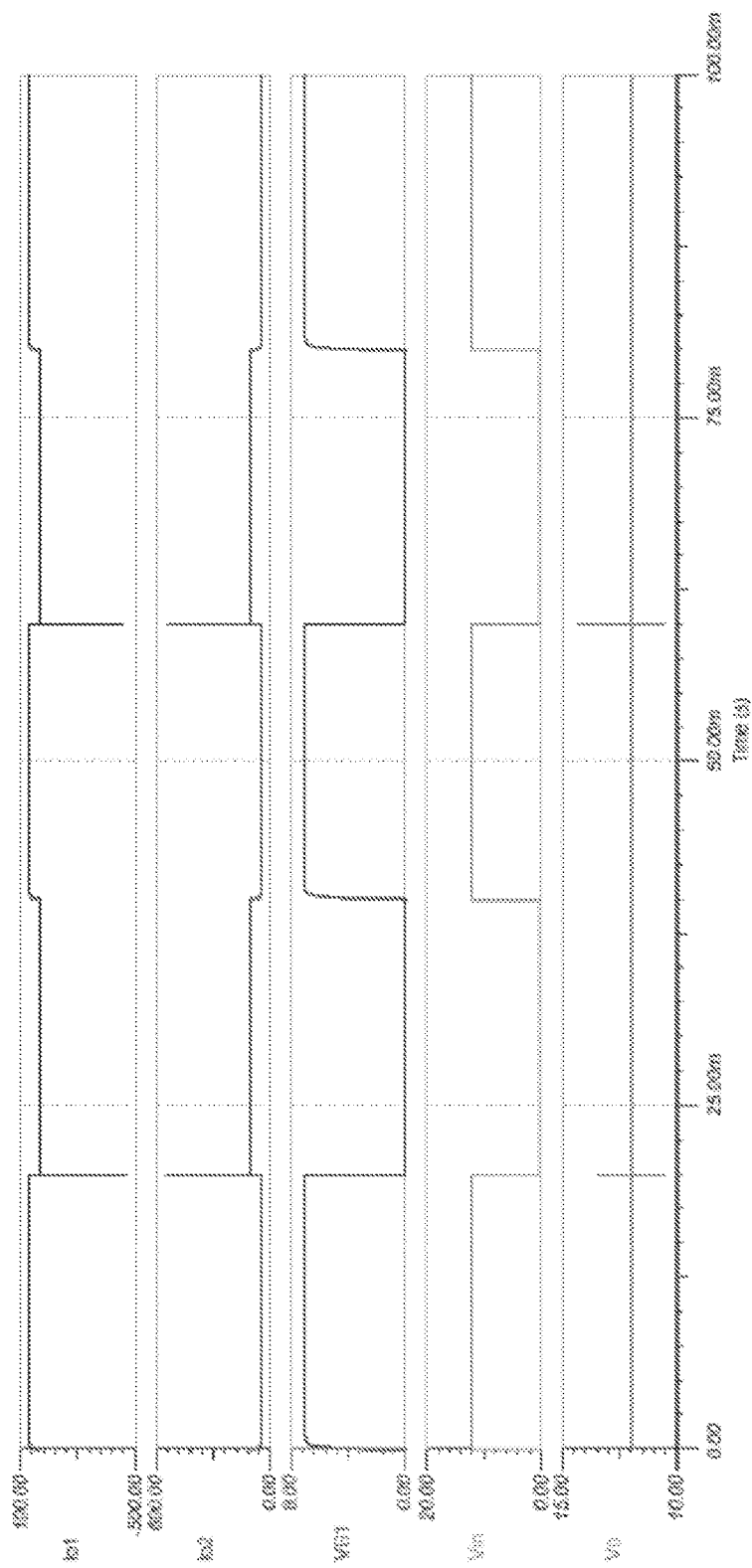
FIG. 2 is a first schematic diagram of the simulating waveform in the prior art.
Figure 3:
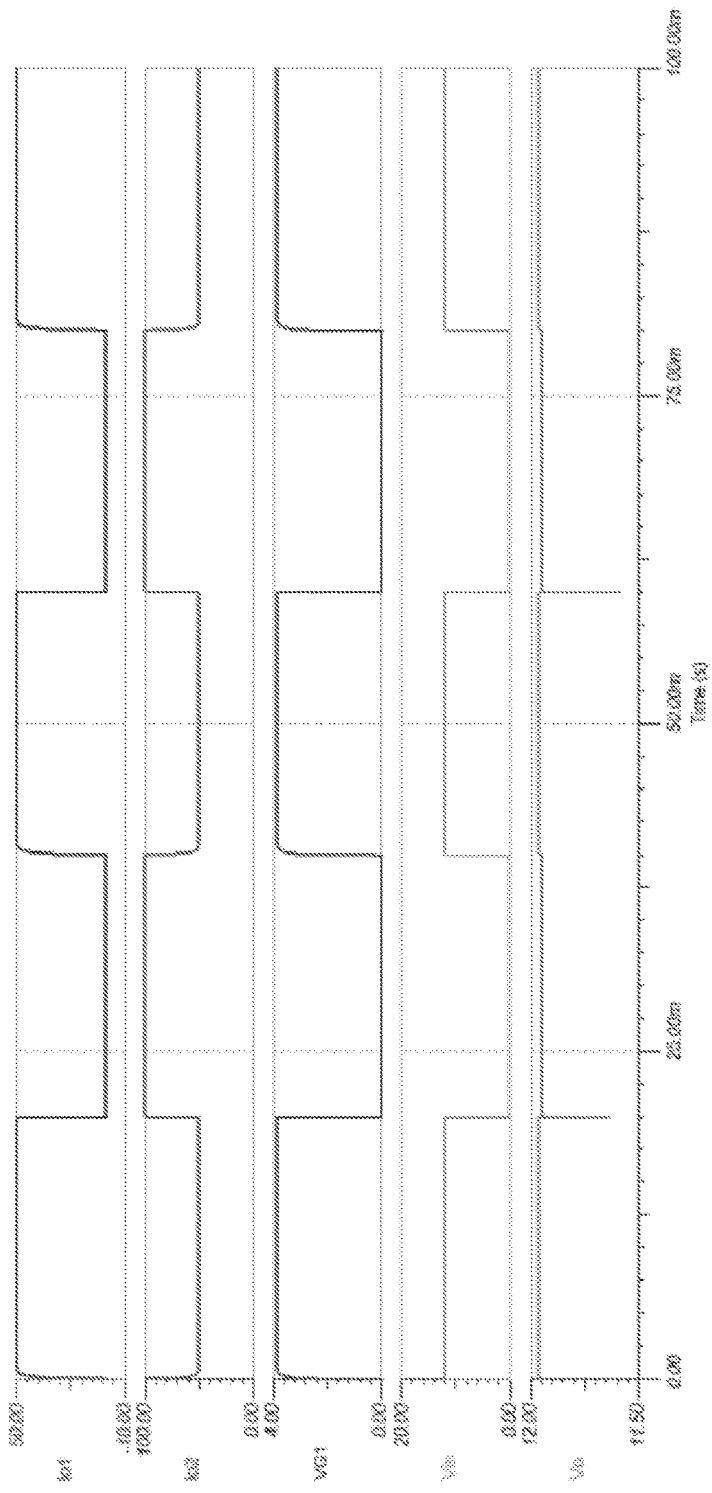
FIG. 3 is a second schematic diagram of the simulating waveform in the prior art.
Figure 4:
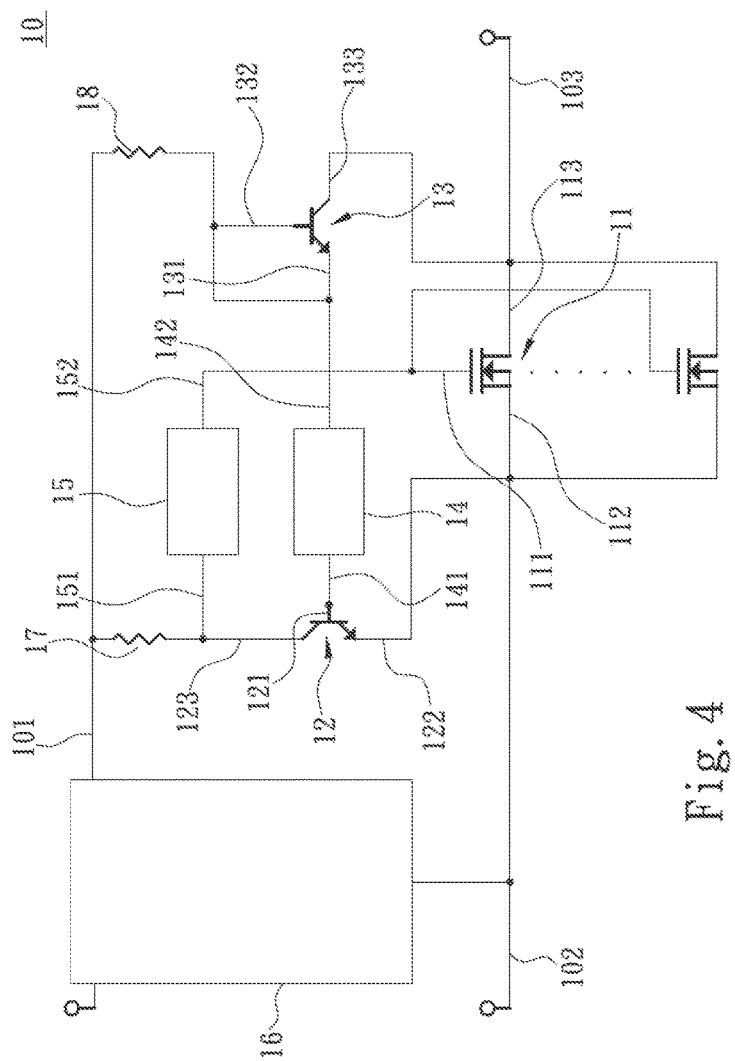
FIG. 4 is a schematic diagram of the circuit of the present invention.

The present invention now will be described in further detail with reference to the drawings.

Referring to FIG. 4, FIG. 5, FIG. 6, FIG. 7, FIG. 8, FIG. 9, FIG. 10 and FIG. 11, the present invention provides a redundant isolating switch control circuit 10 which may be used in a power supply unit (not shown). The redundant isolating switch control circuit 10 comprises a working power supply 101, a power input end 102, a power output end 103, at least one field-effect transistor 11, a first transistor 12 and a second transistor 13. The field-effect transistor 11 comprises a gate electrode 111, a source electrode 112 connected to the power input end 102 and a drain electrode 113 connected to the power output end 103. Further, the power input end 102 is connected to an output end of a power conversion circuit (not shown) in practice to receive the power output by the power conversion circuit. In another aspect, the power output end 103 is actually connected to a load 20 to supply power to the load 20.

Further, the field-effect transistor 11 is considered to be the so-called redundant isolating switch of the present invention, and the number of the field-effect transistors 11 arranged may be adjusted according to the rated output current of the power supply unit. For example, when the rated output current of the power supply unit is relatively large, the number of the field-effect transistors 11 needs to be increased for the redundant isolating switch control circuit 10. A plurality of the field-effect transistors 11 may be used, in which case the plurality of the field-effect transistors 11 are arranged in parallel, and each of the gate electrode 111 of the plurality of the field-effect transistors 11 would be connected and controlled by the same control source, each of the source electrode 112 of the plurality of the field-effect transistors 11 is connected to the power input end 102, and each of the drain electrode 113 of the plurality of the field-effect transistors 11 is connected to the power output end 103.

In the present invention, as described above, the first transistor 12 and the second transistor 13 form a current mirror circuit. The first transistor 12 comprises a first base electrode 121, a first emitter electrode 122 connected to the power input end 102 and a first collector 123 connected to the working power supply 101; and the second transistor 13 comprises a second emitter electrode 131, a second base electrode 132 connected to the working power supply 101 and a second collector 133 connected to the power output end 103, wherein the second base electrode 132 is connected to the second emitter electrode 131. Further, the first transistor 12 and the second transistor 13 may be provided in the same package; in other words, the first transistor 12 and the second transistor 13 can be implemented in the form of a chip package.

Further, in the redundant isolating switch control circuit 10, the current mirror circuit is provided with a first electronic unit 14 and a second electronic unit 15. The first electronic unit 14 comprises a first connecting end 141 connected to the first base electrode 121 and a second connecting end 142 connected to the second emitter electrode 131, and the first electronic unit 14 may be one of a diode, a resistor and a capacitor. Specifically, the first electronic unit 14 is configured so that the first transistor 12 and the second transistor 13 will form the current mirror circuit, as described above; it is derivable, from the operating principle of the current mirror circuit, that the current ($I_{B1}$) of the first transistor 12 is equivalent to the current ($I_{B2}$) of the second transistor 13, i.e. $I_{B1}=I_{B2}$. However, the current of the first transistor 12 is different from that of the second transistor 13 due to the load current of the field-effect transistor 11, so that the first transistor 12 and the second transistor 13 both are turned off or on with respect to each other, thereby controlling the turn-on and turn-off of the field-effect transistor 11. Herein, in order to prevent the second transistor 13 and the power supply unit from burning when turned off or in an off state because of the use of the conventional circuit, the present invention is implemented by the above method. Additionally, in the present invention, compensation of the parameters may be achieved by the settings of the first electronic unit 14 so as to make the operation of the first transistor 12 clearer and improve the response speed of the field-effect transistor 11.

In another aspect, the second electronic unit 15 comprises a third connecting end 151 connected to the first collector 123 and a fourth connecting end 152 connected to the gate electrode 111. The second electronic unit 15 is one of an integrated circuit module for turn-on and turn-off control (also referred to as a drive IC), a diode and a resistor. More specifically, since the second electronic unit 15 plays an important role in driving the field-effect transistor 11, the second electronic unit 15 is selected for use depending on the number of the field-effect transistors 11. For example, when a large number of field-effect transistors 11 require a large amount current for driving, the second electronic unit 15 can be implemented as the drive IC.

The redundant isolating switch control circuit 10 further comprises a voltage stabilizing unit 16 connected to the power input end 102 and comprising the working power supply 101. The voltage stabilizing unit 16 may be implemented as a voltage stabilizing circuit or a voltage stabilizing IC. In another aspect, the redundant isolating switch control circuit 10 comprises a first resistor 17 provided between the working power supply 101 and the first collector 123, and a second resistor 18 provided between the working power supply 101 and the second base electrode 132.

Figure 5:
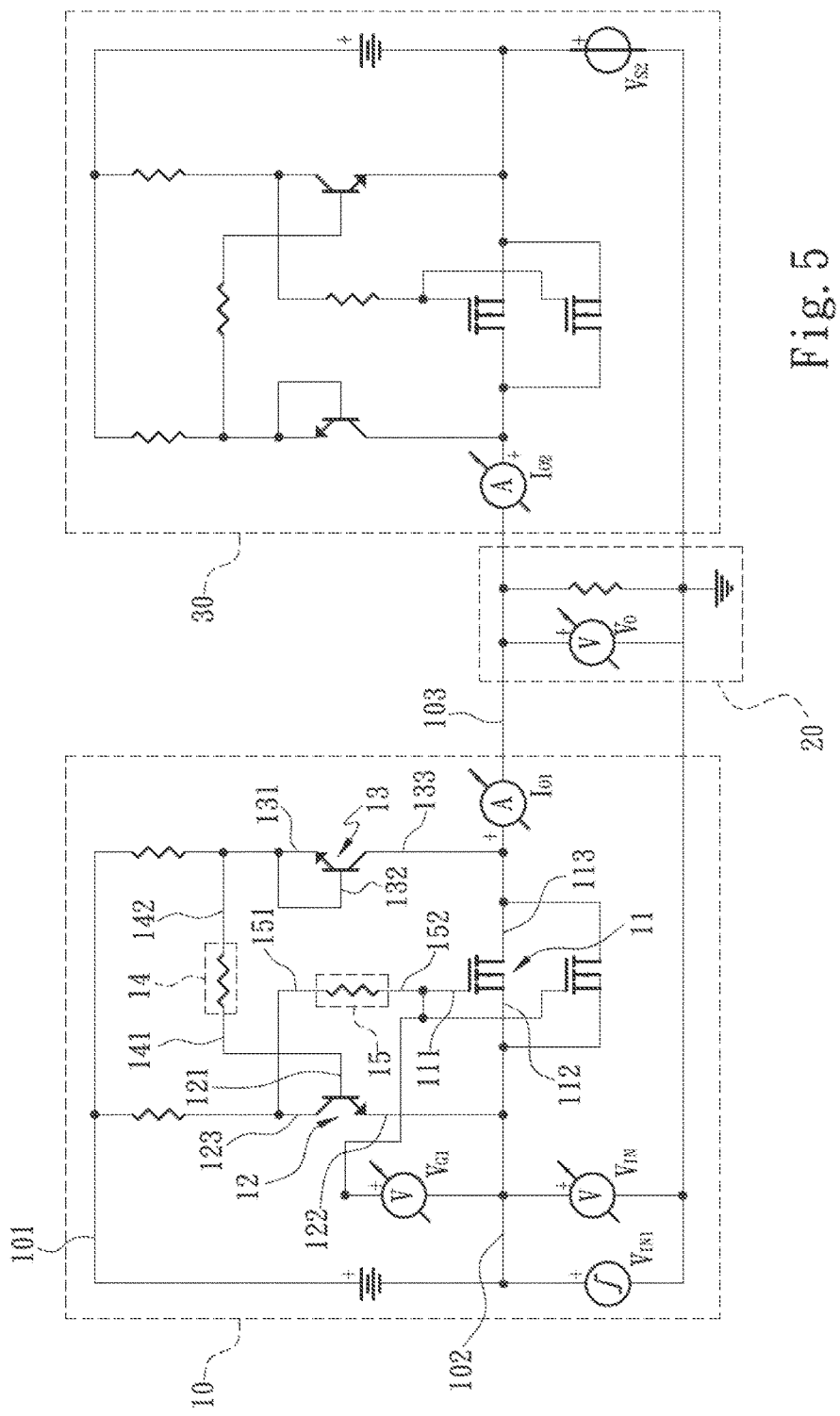
FIG. 5 is a schematic diagram of the circuit according to the first embodiment of the present invention.
Figure 6:
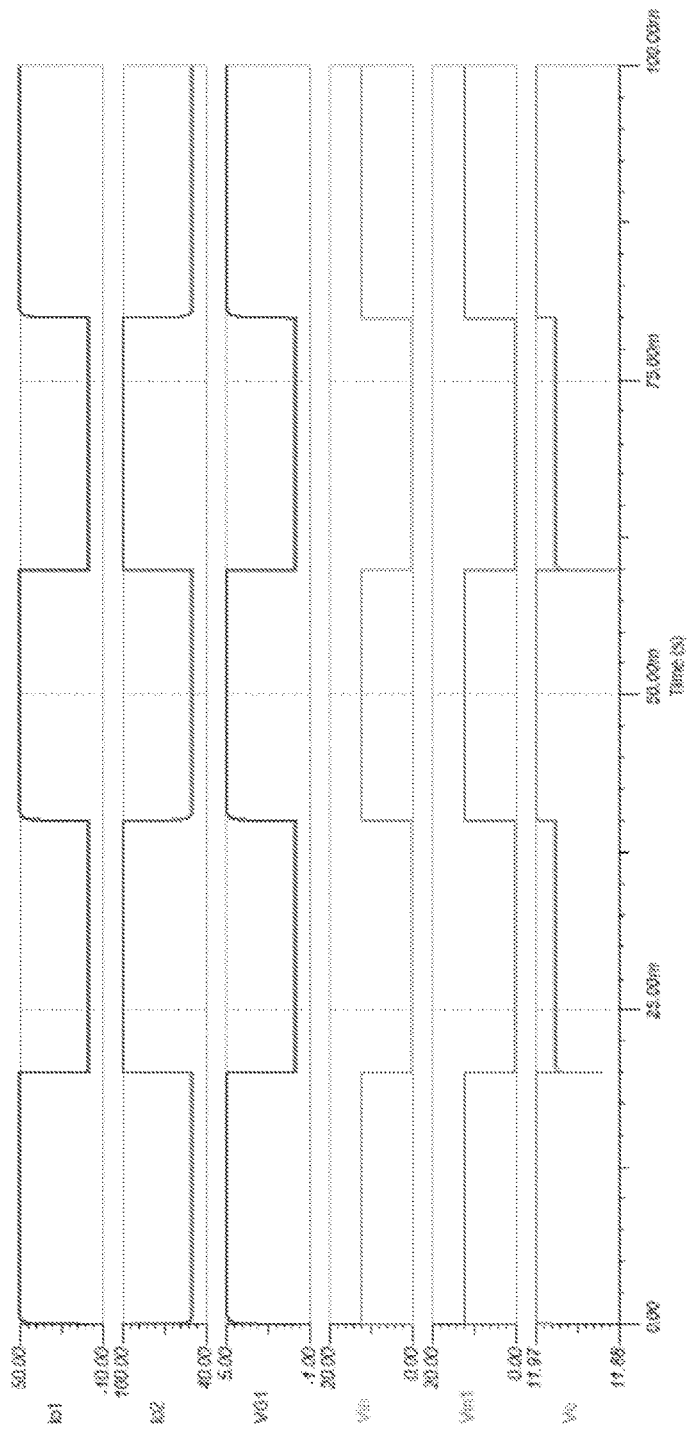
FIG. 6 is a schematic diagram of the simulating waveform according to the first embodiment of the present invention.
Figure 7:
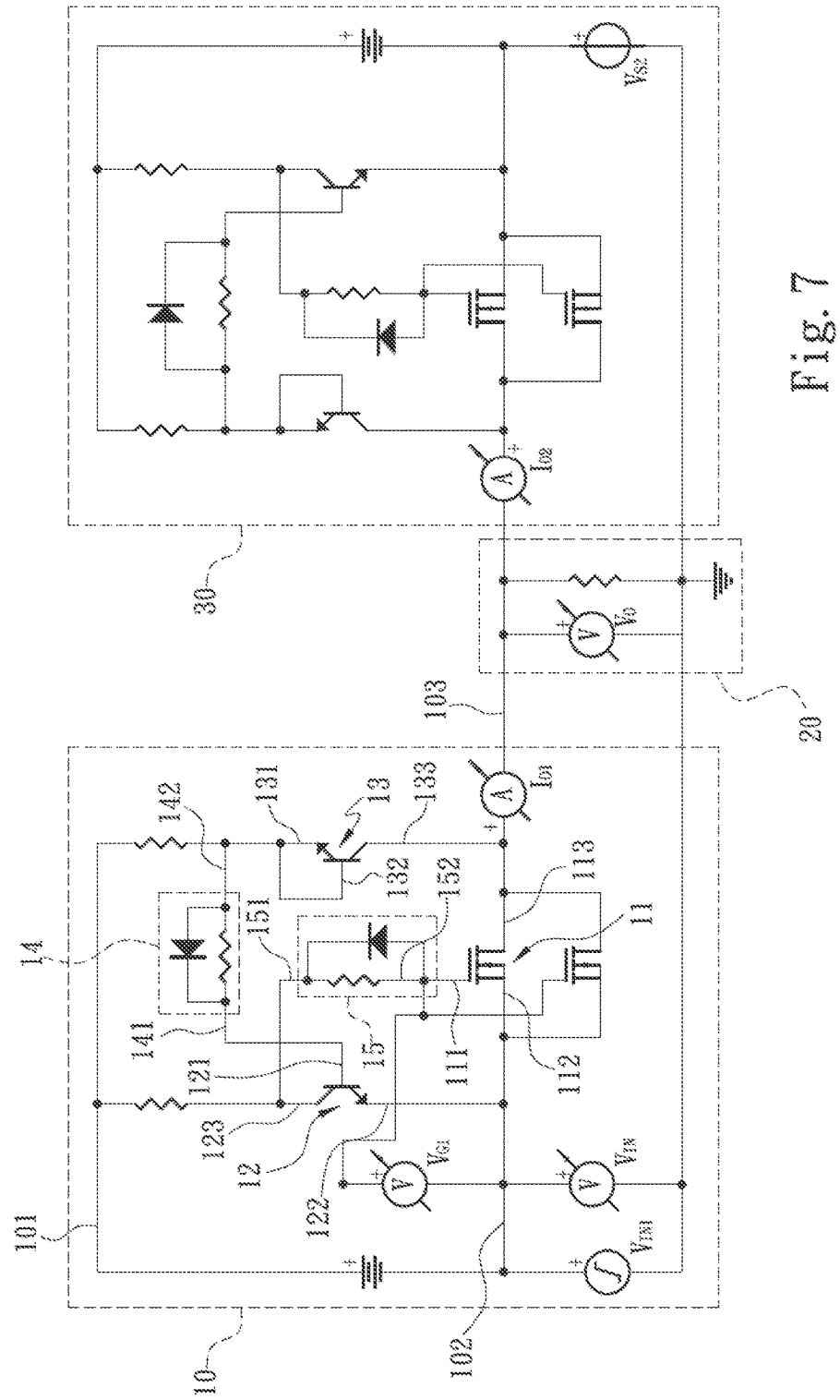
FIG. 7 is a schematic diagram of the circuit according to the second embodiment of the present invention.
Figure 8:
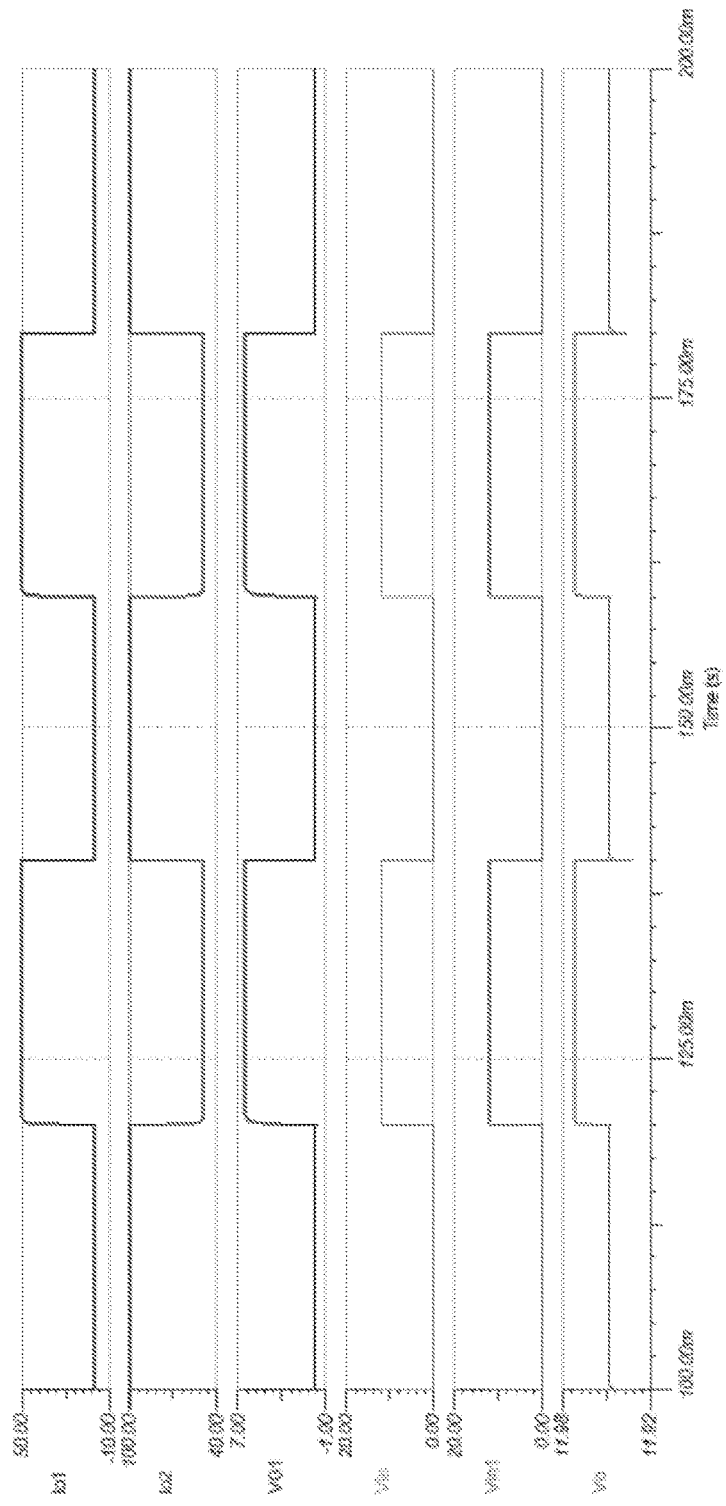
FIG. 8 is a schematic diagram of the simulating waveform according to the second embodiment of the present invention.
Figure 9:
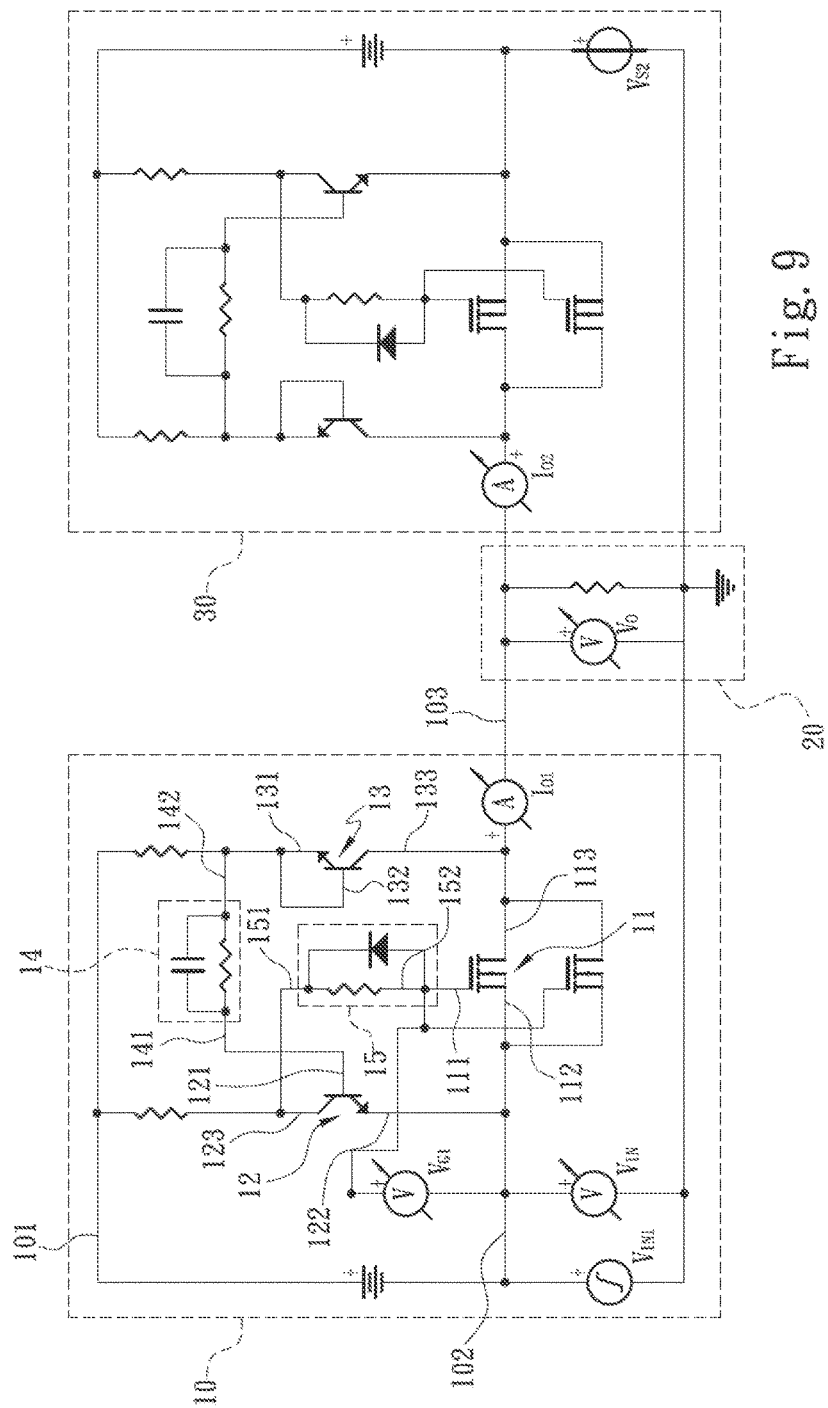
FIG. 9 is a schematic diagram of the circuit according to the third embodiment of the present invention.
Figure 10:
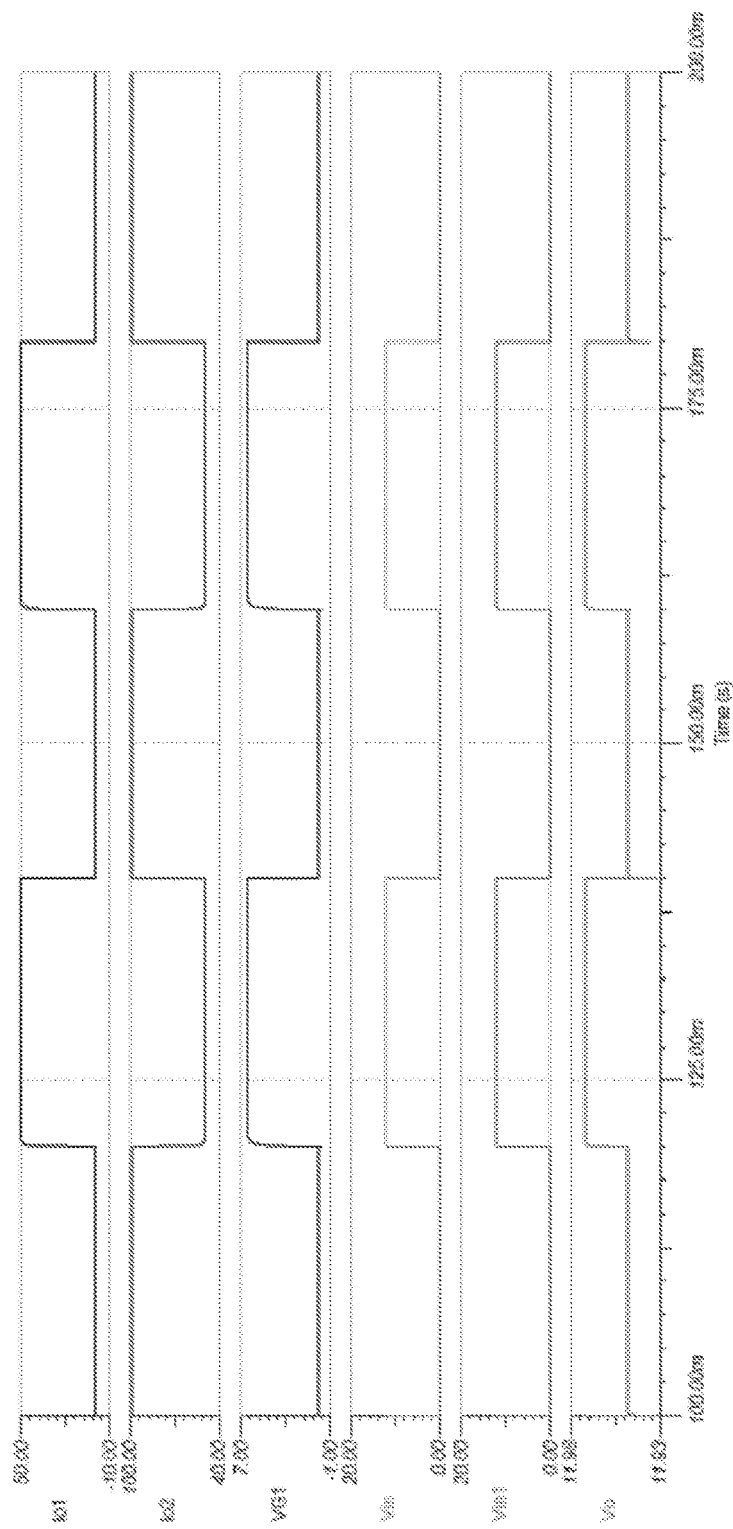
FIG. 10 is a schematic diagram of the simulating waveform according to the third embodiment of the present invention.
Figure 11:
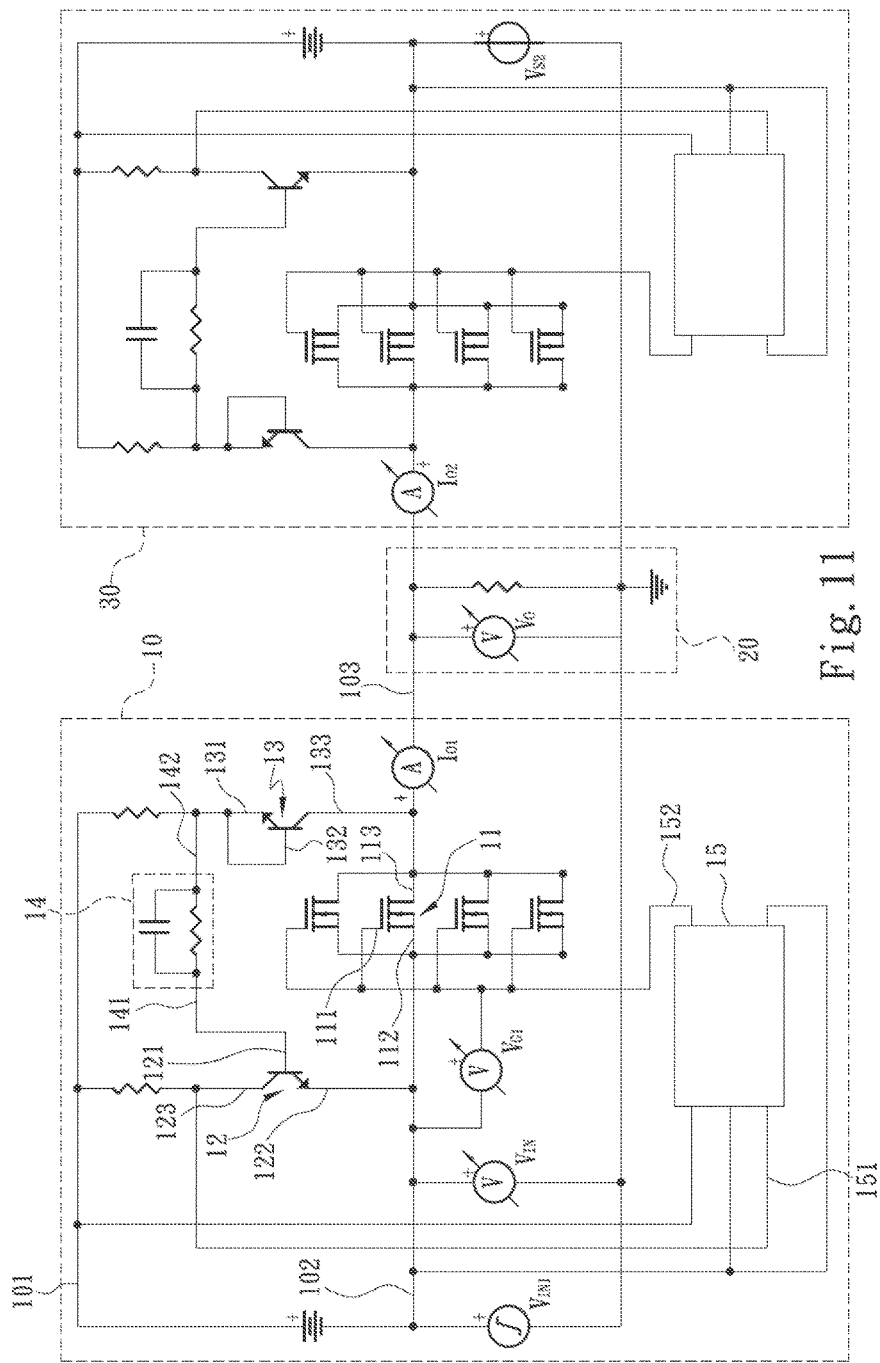
FIG. 11 is a schematic diagram of the circuit according to the fourth embodiment of the present invention.
Figure 12:
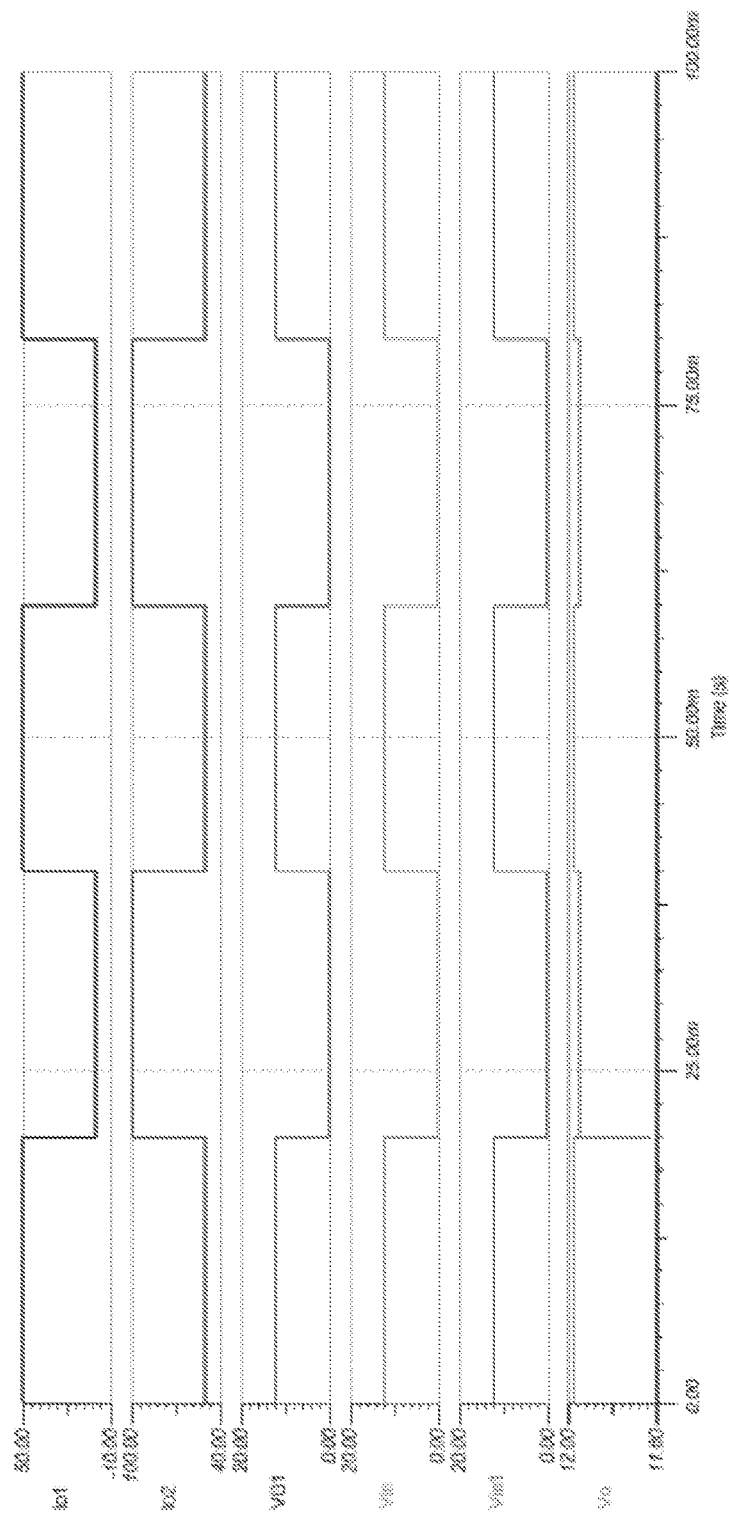
FIG. 12 is a schematic diagram of the simulating waveform according to the fourth embodiment of the present invention.

In one embodiment, referring to FIG. 5 again, simulation of the redundant isolating switch control circuits 10 and 30 in the different operating states has been performed herein, in which the first electronic unit 14 and the second electronic unit 15 are resistors, respectively. The redundant isolating switch control circuit 10 is set to have a power at the power input end 102 ($V_{IN1}$) of 12 volts (V), a turn-on time of 20 ms, and a turn-off time of 20 ms; while the redundant isolating switch control circuit 30 is set to have a power at the power input end ($V_{s2}$) of 12 volts (V) and be held at a turn-on state. Additionally, the load 20 of 100 amperes (A) and 0.12 ohms (Ω) is provided. In another aspect, as shown in FIG. 5, the first voltage measurement unit ($V_{G1}$) is configured to measure the gate-source voltage ($V_{GS}$) of the field-effect transistor 11; the first current measurement unit ($I_{O1}$) is configured to measure the output current of the redundant isolating switch control circuit 10; the second current measurement unit ($I_{O2}$) is configured to measure the output current of the redundant isolating switch control circuit 30; the second voltage measurement unit ($V_{IN}$) is configured to measure the voltage at the power input end 102 of the redundant isolating switch control circuit 10; and the third voltage measurement unit ($V_O$) is configured to measure the terminal voltage of the load 20. The results of such simulation are shown in FIG. 6. Further, in an embodiment, with reference to FIG. 7, the simulation conditions are similar to the above embodiment and will not be repeated, except that the first electronic unit 14 and the second electronic unit 15 are a parallel combination of a diode and a resistor, respectively, and the results of such simulation are shown in FIG. 8. Further, in an embodiment, with reference to FIG. 9, the simulation conditions are similar to the above embodiments and will not be repeated, except that the first electronic unit 14 is a parallel combination of a capacitor and a resistor and while the second electronic unit 15 is a parallel combination of a diode and a resistor, and the results of such simulation are shown in FIG. 10. Further, in an embodiment, with reference to FIG. 11, the simulation conditions are similar to the above embodiments and will not be repeated, except that the first electronic unit 14 is a parallel combination of a capacitor and a resistor and while the second electronic unit 15 is a drive IC, and the results of such simulation are shown in FIG. 12.

As can be seen from FIG. 6, FIG. 8, FIG. 10 and FIG. 12, the redundant isolating switch control circuit 10 of the present invention improves the response speed of the field-effect transistor 11 and effectively decreases the reverse current generated by instantaneous voltage drop at the power input end 102 of the redundant isolating switch control circuit 10; furthermore, the gate-source voltage ($V_{GS}$) of the field-effect transistor 11 can be increased to 5 volts or more upon applying a voltage to the power input end 102, thereby taking the conduction loss of the field-effect transistor 11 into account.

What is claimed is:

1. A redundant isolating switch control circuit, comprising:
   a working power supply;
   a power input end and a power output end;
   at least one field-effect transistor comprising a gate electrode, a source electrode connected to the power input end and a drain electrode connected to the power output end;
   a first transistor comprising a first base electrode, a first emitter electrode connected to the power input end and a first collector connected to the working power supply;
   a second transistor comprising a second emitter electrode, a second base electrode connected to the working power supply and a second collector connected to the power output end, wherein the second base electrode is connected to the second emitter electrode;
   a first electronic unit comprising a first connecting end connected to the first base electrode and a second connecting end connected to the second emitter electrode; and
   a second electronic unit comprising a third connecting end connected to the first collector and a fourth connecting end connected to the gate electrode;
   wherein the first electronic unit is one of a diode parallel with a resistor and a capacitor parallel with a resistor, and wherein the second electronic unit is one of an integrated circuit module for turning on or turning off the field-effect transistor and a diode parallel with a resistor.

2. The redundant isolating switch control circuit according to claim 1, wherein the redundant isolating switch control circuit comprises a plurality of the field-effect transistors arranged in parallel, and each of the gate electrode of the plurality of the field-effect transistors is connected to the fourth connecting end of the second electronic unit, each of the source electrode of the plurality of the field-effect transistors is connected to the power input end, and each of the drain electrode of the plurality of the field-effect transistors is connected to the power output end.

3. The redundant isolating switch control circuit according to claim 2, wherein the redundant isolating switch control circuit comprises a voltage stabilizing unit connected to the power input end and comprising the working power supply.

4. The redundant isolating switch control circuit according to claim 3, wherein the redundant isolating switch control circuit comprises a first resistor provided between the working power supply and the first collector, and a second resistor provided between the working power supply and the second base electrode.

5. The redundant isolating switch control circuit according to claim 1, wherein the redundant isolating switch control circuit comprises a voltage stabilizing unit connected to the power input end and comprising the working power supply.

* * * * *